United States Patent
Liaw

(10) Patent No.: US 7,250,657 B2
(45) Date of Patent: Jul. 31, 2007

(54) LAYOUT STRUCTURE FOR MEMORY ARRAYS WITH SOI DEVICES

(75) Inventor: Jhon-Jhy Liaw, Hsin-Chu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 215 days.

(21) Appl. No.: 11/078,745

(22) Filed: Mar. 11, 2005

(65) Prior Publication Data

US 2006/0202361 A1 Sep. 14, 2006

(51) Int. Cl.
*H01L 27/01* (2006.01)
*H01L 29/04* (2006.01)

(52) U.S. Cl. .................. 257/350; 257/69; 257/903
(58) Field of Classification Search .............. 257/66, 257/67, 69, 379–381, 903, 904
See application file for complete search history.

(56) References Cited

U.S. PATENT DOCUMENTS 5,619,056 A * 4/1997 Kuriyama et al. .......... 257/369
6,646,305 B2   11/2003 Assaderaghi et al. ....... 257/347
6,747,323 B2 *  6/2004 Komori ...................... 257/393
6,933,578 B2 *  8/2005 Sato .......................... 257/393

* cited by examiner

*Primary Examiner*—Hung Vu
(74) *Attorney, Agent, or Firm*—Kirkpatrick & Lockhart Preston Gates Ellis LLP

(57) ABSTRACT

A layout structure of a static random access memory (SRAM) cell array includes at least one SRAM cell area, oxide defined (OD) area and strapping cell area. The SRAM cell area has a longitudinal side being at least twice longer than a transverse side thereof. The oxide defined (OD) area is formed on an insulating layer, extending across at least two neighboring SRAM cell areas for construction of a passing gate transistor and a pull-down transistor used in an SRAM cell. The strapping cell area is interposed between the SRAM cell areas, in which a strapping cell is constructed for connecting the OD area to a fixed potential, thereby preventing bodies of the passing gate transistor and the pull-down transistor constructed on the OD area from floating.

20 Claims, 7 Drawing Sheets

LAYOUT STRUCTURE FOR MEMORY ARRAYS WITH SOI DEVICES

BACKGROUND

The present invention relates generally to semiconductor memories, and more particularly to a layout structure for a memory array with semiconductor-on-insulator (SOI) devices.

While semiconductor memories continue to be designed in larger arrays, the individual cells and structures within them continue to decrease in size. Speed is increased and operating voltage is decreased as memory cells become smaller. Structures such as SOI and fin shaped field-effect-transistors (FinFETs) have emerged in recent years to reduce footprints of individual memory cells.

Besides the source, gate, and drain of a metal-oxide-semiconductor (MOS) transistor, the body also needs to be connected to a fixed potential. The body of a transistor could be viewed as the other side of the gate. The gate operates by charging the capacitance between the gate electrode and the active channel that is beneath the gate electrode. If the electrical potential of the body is changed, the bias applied to the gate electrode that is necessary to turn on the transistor will also change. This may result in a shift in the threshold voltage, $V_T$, which is the designed gate voltage at which logic state switching occurs. For example, if the body is floating, it may accumulate charge and the threshold voltage may shift. A change of the threshold voltage of a transistor may cause the performance of a memory that contains the transistor unpredictable.

As more and more memories are formed with SOI transistors, connecting the bodies of the SOI transistors to a fixed potential becomes a challenging issue. As such, desirable in the art of memory designs are layout structures that allow a compact memory cell array formed with SOI transistors having their bodies properly connected to a fixed potential for preventing a threshold voltage shift caused by a floating body.

SUMMARY

The invention discloses a layout structure of a static random access memory (SRAM) cell array having one or more SRAM cells, each of which has a pair of cross-coupled inverters and a pair of passing gate transistors coupled to the inverters for controlling outputs thereof. In one embodiment, the layout structure includes at least one SRAM cell area in which the inverters and the passing gate transistors are constructed, having a longitudinal side being at least twice longer than a transverse side thereof. At least one oxide defined (OD) area is formed on an insulating layer, extending across at least two neighboring SRAM cell areas for construction of the passing gate transistor and a pull-down transistor within the inverter thereon. At least one strapping cell area is interposed between the SRAM cell areas, in which a strapping cell is constructed for connecting the OD area to a fixed potential, thereby preventing bodies of the passing gate transistor and the pull-down transistor constructed on the OD area from floating.

The construction and method of operation of the invention, however, together with additional objects and advantages thereof will be best understood from the following description of specific embodiments when read in connection with the accompanying drawings.

DESCRIPTION

Figure 1:
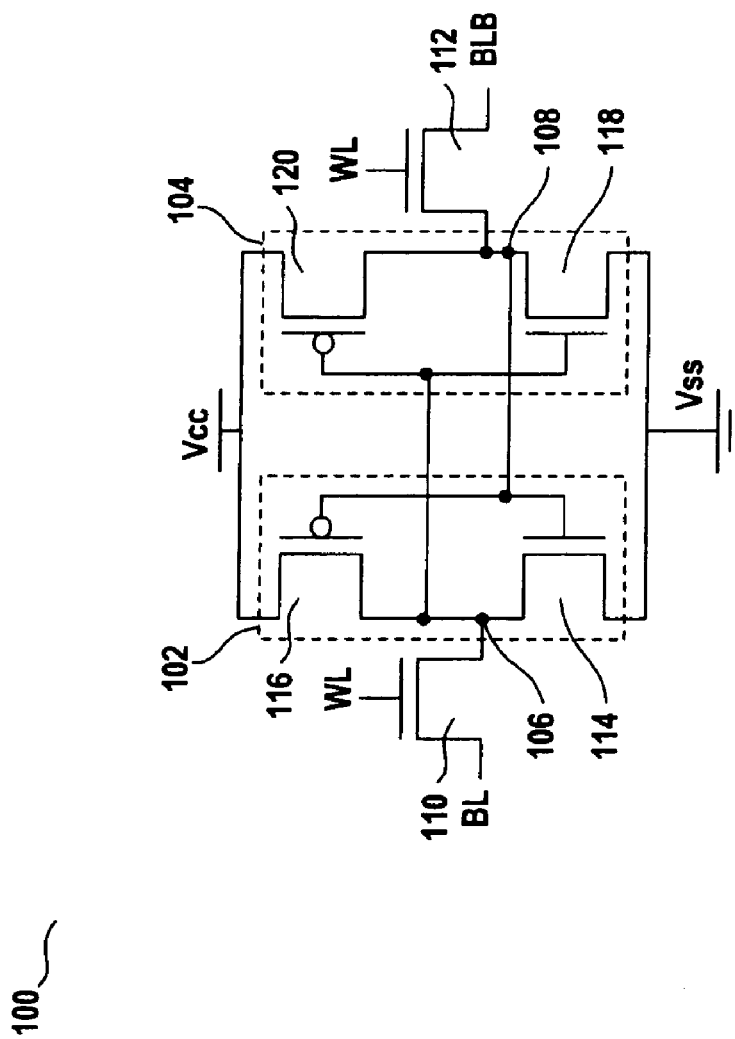
FIG. 1 schematically illustrates a conventional static random access memory (SRAM) cell.

FIG. 1 illustrates a conventional six-transistor SRAM cell 100 that is constructed of two cross-coupled inverters 102 and 104. A storage node 106 of the inverter 102 is directly connected to the gates of both transistors of the inverter 104. A storage node 108 of the inverter 104 is directly connected to the gates of both transistors of the inverter 102. The inverter 102 contains a pull-down (PD) transistor 114 that is connected to ground, or Vss, and a pull-up (PU) transistor 116 that is connected to a supply voltage, or Vcc. The inverter 104 contains a PD transistor 118 that is connected to Vss and a PU transistor 120 that is connected to Vcc. The output of the storage node 106 of the inverter 102 is controlled by a passing gate (PG) transistor 110 that is connected to a bit line (BL). The output of the storage node 108 of the inverter 104 is controlled by a PG transistor 112 that is connected to a complementary bit line (BLB). The two PG transistors 110 and 112 are controlled by a common word line (WL). It is understood that a storage node is a capacitor that is composed of the near junction capacitances of the three transistors that are connected to the storage node. As opposite logic state signals are fed to the bit line BL and the complementary bit line BLB, the memory cell latches in a high or low state until rewritten.

As discussed above, when the transistors 110, 112, 114, 116, 118 and 120 are constructed on an SOI structure, there is a need of properly connecting their bodies to fixed potentials. For example, the bodies of the NMOS transistors 110, 112, 114 and 118 need to be connected to Vss, and the bodies of the PMOS transistors 116 and 120 need to be connected to Vcc. Properly connected bodies help to prevent undesired threshold voltage shifts of the transistors.

The present invention discloses a layout structure for an SRAM cell array. Each SRAM cell has one or more transistors whose bodies are connected to fixed potentials, such as Vcc and Vss, through a low resistance path. This avoids the body floating and, therefore, preventing a shift of the threshold voltage. The layout structure includes one or more SRAM cell areas, in which the cross-coupled inverters and the PG transistors are constructed. Each SRAM cell area has a longitudinal side and a transverse side. A plurality of SRAM cell areas are arranged in a manner that their transverse sides are in alignment with each other. An oxide defined (OD) area formed on an SOI structure extends across at least two neighboring SRAM cell areas for construction of the PG transistors and PD transistors. One or more gate areas are disposed transversely across the OD area, to serve as the gate electrodes for the PG or PD transistors. A strapping cell area, in which a strapping cell is formed, is disposed adjacent to the SRAM cell areas for connecting the bodies of the PG and PD transistors, which are constituted by the OD layer, to a fixed potential, such as Vss or Vcc. This helps to avoid a shift of threshold voltage caused by a floating body.

Figure 2:
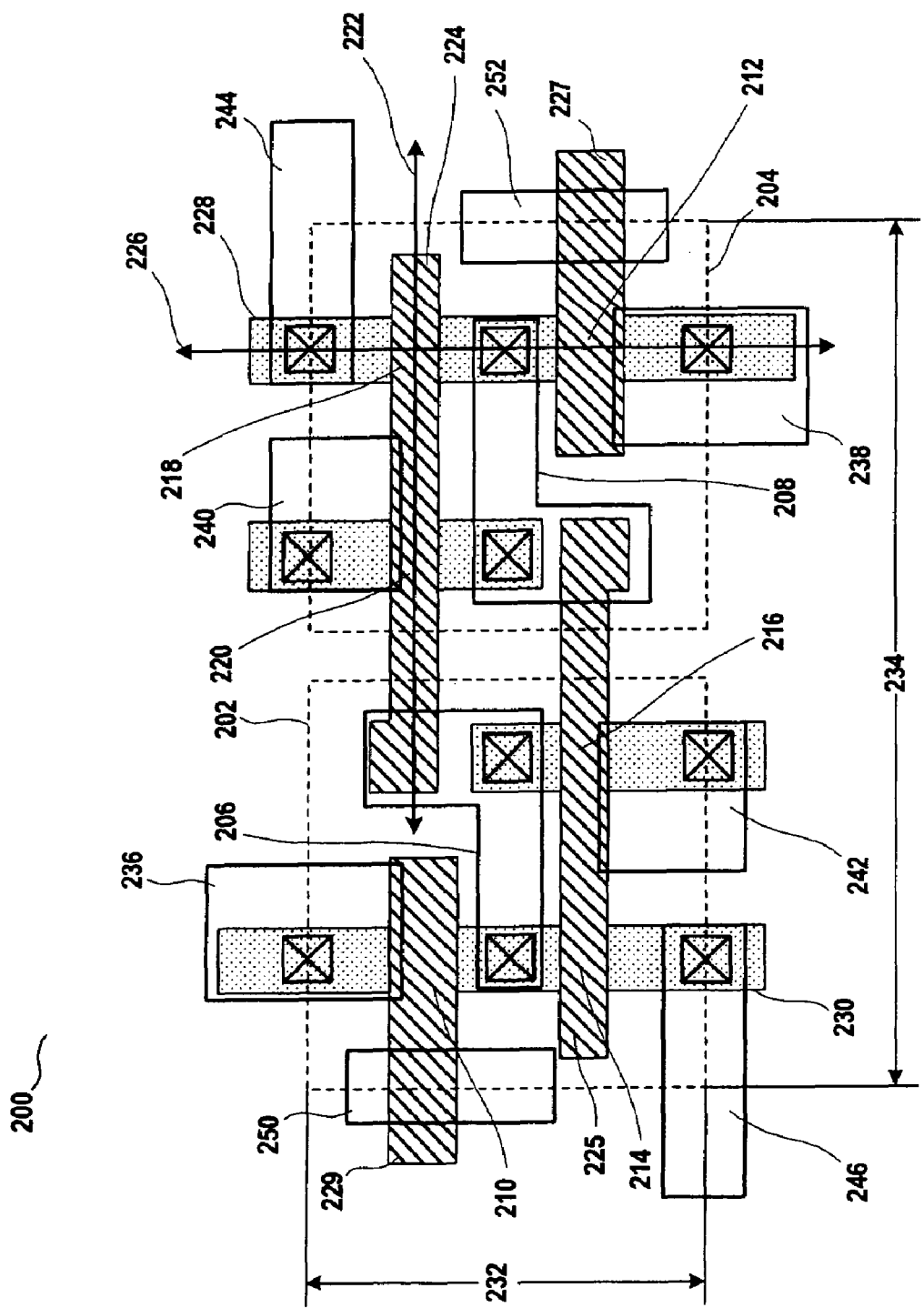
FIG. 2 illustrates a layout structure of an SRAM cell, according to one embodiment of the present invention.

In FIG. 2, a layout structure 200 realizes of the SRAM cell shown in FIG. 1 in accordance with one embodiment of the present invention. The layout structure 200 has a transverse side 232 that is no longer than about 0.5 µm. The layout structure 200 has at least one bit line 236 and complementary bit line 238. One or more Vcc lines 240 and 242 and Vss lines 244 and 246 are disposed adjacent to the bit line 236 and its complement 238. Gate areas 224, 225, 227 and 229 for inverters 202 and 204 and PG transistors 210 and 212 are laid out in a direction substantially parallel to the longitudinal side 234 of the layout structure 200. The SRAM cell presented by the layout structure 200 is constructed of two cross-coupled inverters 202 and 204. A storage node 206 of the inverter 202 is directly connected to the gates of both transistors 218 and 220 of the inverter 204. A storage node 208 of the inverter 204 is directly connected to the gates of both transistors 216 and 214 of the inverter 202. The output of the storage node 206 is controlled by a PG transistor 210 that is connected to the bit line 236. The output of the storage node 208 of the inverter 204 is controlled by the PG transistor 212 that is connected to the complementary bit line 238. The two PG transistors 210 and 212 are controlled by the word lines 250 and 252. The inverter 202 includes a PD transistor 214 that is connected to Vss through the Vss line 246, and a PU transistor 216 that is connected to Vcc through the Vcc line 242. The inverter 204 includes a PD transistor 218 that is connected to Vss through the Vss line 244, and a PU transistor 220 that is connected to Vcc through the Vcc line 240.

A section line 222 lies centered along the longitudinal direction of the gate area 224 that is shared by the PD transistor 218 and the PU transistor 220 of the inverter 204. This section line 222 will be used for illustration purposes in FIGS. 3 and 5. A section line 226 lies centered along the longitudinal direction of the OD area 228 on which the source/drain regions of the PD transistor 218 and the PG transistor 212 are constructed. This section line 226 will be used for illustration purposes in FIGS. 4 and 6.

The longitudinal sides of OD areas 228 and 230 are substantially parallel to the transverse side 232 of the layout structure 200. The thickness of the OD areas 228 and 230 is between about 200 and 1500 angstroms. The longitudinal side 234 of the layout structure 200 is at least twice as long as its transverse side. Since the transverse side is significantly short compared to the longitudinal side, the resistance of the OD areas 228 and 230 is relatively low.

Figure 7:
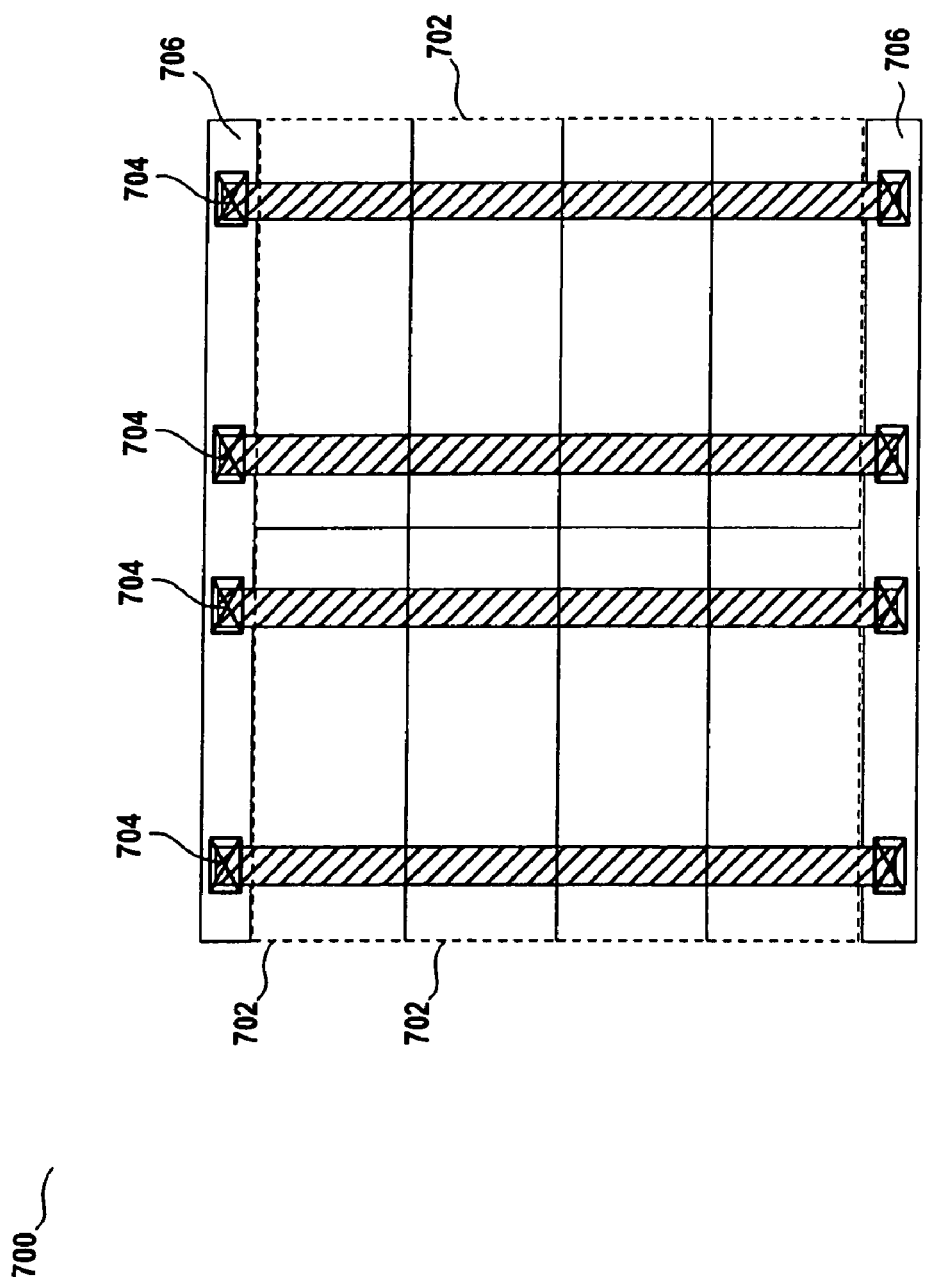
FIG. 7 illustrates a layout structure of an SRAM cell array, according to one embodiment of the present invention.

FIG. 7 illustrates a layout structure 700 showing a plurality of memory cell areas 702 arranged in an SRAM cell array. The layout structure 700 is repeated with some periodic mirror imaging in an SRAM cell array. A large number of SRAM cell areas 702 can be placed in an edge-to-edge manner. The OD areas 704 extend across at least two neighboring SRAM cell areas. Since the transverse side of each SRAM cell area 702 is relatively short, one OD area 704 can run across a number of SRAM cell areas 702 without accumulating excessive resistance. As such, the SRAM cell areas 702 can be made compact in the layout structure 700.

In this embodiment, the transistors constructed in the SRAM cell areas 704 are SOI devices. One or more strapping cell areas 706 are interposed between the SRAM cell areas 702. The strapping cell areas 706 are connected to the OD areas 704 for connecting the bodies of the transistors in the SRAM cell area 704 to a fixed potential. For every two consecutive strapping cell areas 706, 8 to 128 SRAM cell areas are interposed therebetween. In this exemplary embodiment, there are 8 SRAM cell areas interposed between every two consecutive strapping cell areas 706, and the maximum distance from any transistor in the SRAM cell area 702 to a strapping cell in the strapping cell area 706 is no longer than about 16 µm. The strapping cell areas 706 prevent the bodies of the transistors in the SRAM cell area 702 from floating, thereby helping to stabilize their electrical characteristics, such as the threshold voltage, drive current and standby leakage.

Figure 3:
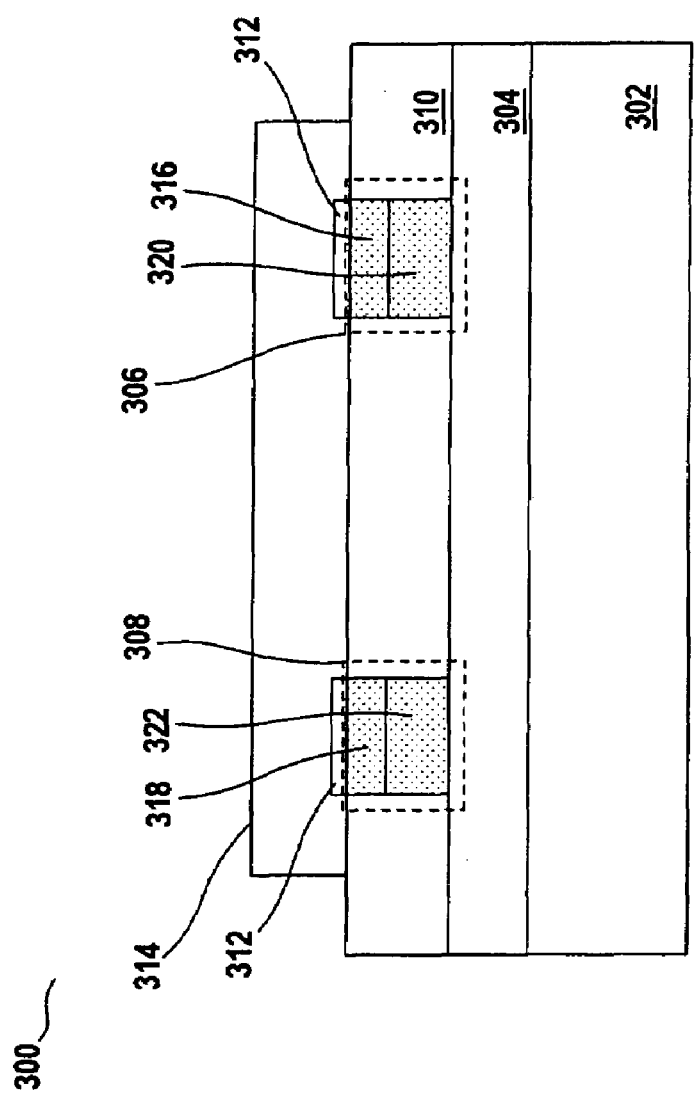
FIGS. 3-4 illustrate cross-sectional views of SOI transistors used in an SRAM cell, according to one embodiment of the present invention.
Figure 4:
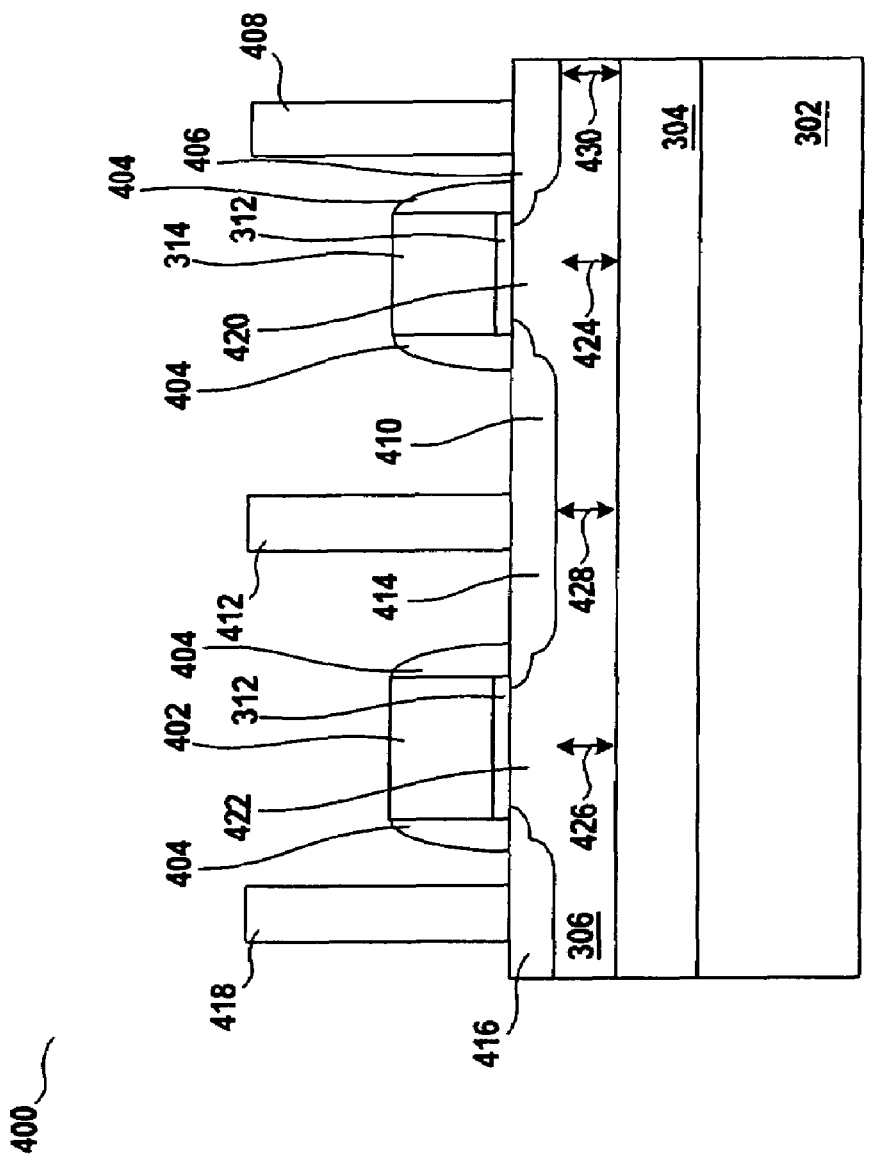

FIGS. 3 and 4 present an example of SOI devices used on an SRAM cell according to one embodiment of the present invention. FIG. 3 illustrates a cross-sectional view 300 along the section line 222 shown in FIG. 2. An insulating layer 304 lies on the substrate 302. A silicon layer that was previously formed on the insulating layer 304 is patterned to form silicon islands 306 and 308. The silicon island 306 is P-doped silicon for the PD transistor. Similarly, the silicon island 308 is N-doped silicon for the PU transistor. A dielectric layer 310 is deposited. A gate dielectric 312 is formed on the exposed surface of the silicon islands 306 and 308. A gate electrode material, typically poly crystalline silicon, is deposited and patterned to form the gate electrode 314 for both the PD transistor and the PU transistor where the poly silicon of the gate electrode 314 crosses the width of silicon islands 306 and 308 respectively.

The active MOS channels 316 and 318 lie under the gate electrode 314 and the gate dielectric 312. Since the PD transistor and the PU transistor are partially depleted SOI transistors, the active MOS channel does not extend to the full height of the silicon islands 306 and 308. A lower P-type layer 320 is left in silicon island 306 as the P-well or body of the PD transistor. A lower N-type layer 322 is left in silicon island 308 as the N-well or body of the PU transistor. The P-type layer 320 is a part of the continuous OD area.

FIG. 4 illustrates a cross-sectional view 400 along the section line 226 shown in FIG. 2. The substrate 302 and the insulating layer 304 are the same as those in FIG. 3. This view shows the same gate dielectric 312 as shown in FIG. 3. This view also shows the width of the gate electrode 314 for the PD transistor, the width of the gate electrode 402 for the PG transistor, and the length of the silicon island 306 for those two transistors. The gate electrodes 314 and 402 have sidewall spacers 404. The PD transistor has the gate electrode 314, a source diffusion region 406 with a source electrode 408, and a drain diffusion region 410 with a drain electrode 412. The PG transistor has the gate electrode 402, a drain diffusion region 414 with the drain electrode 412, and a source diffusion region 416 with a source electrode 418. It is understood that the drain electrode 412 is shared by both the PD and the PG transistors.

In the present invention, the PD transistor and the PG transistor are partially depleted SOI devices. This means that the depletion region of an active NMOS channel 420, that is under the gate 314, and an active NMOS channel 422, that is under the gate 402, do not extend to the full height of the silicon island. A remaining height 424 of the silicon beneath the active NMOS channel 420 is the P-well or body of that NMOS transistor. A remaining height 426 of the silicon beneath the active NMOS channel 422 is the P-well or body of that NMOS transistor. A remaining height 428 of the silicon beneath the drain diffusion region 410 and the drain diffusion region 414 is part of the original P-doped silicon island 306.

Therefore, the lower portions of the finished P-doped silicon island 306 are all P-type and a continuous P-type layer lies along its entire length with no interruption. This is the OD area 430 that connects the bodies 424 and 426 of all of the PD and PG transistors to Vss via the strapping cell area 706 as shown in FIG. 7. This OD area 430 has low electrical resistance due to the relatively short transverse side of each SRAM cell area, thereby providing a good static noise margin.

Figure 5:
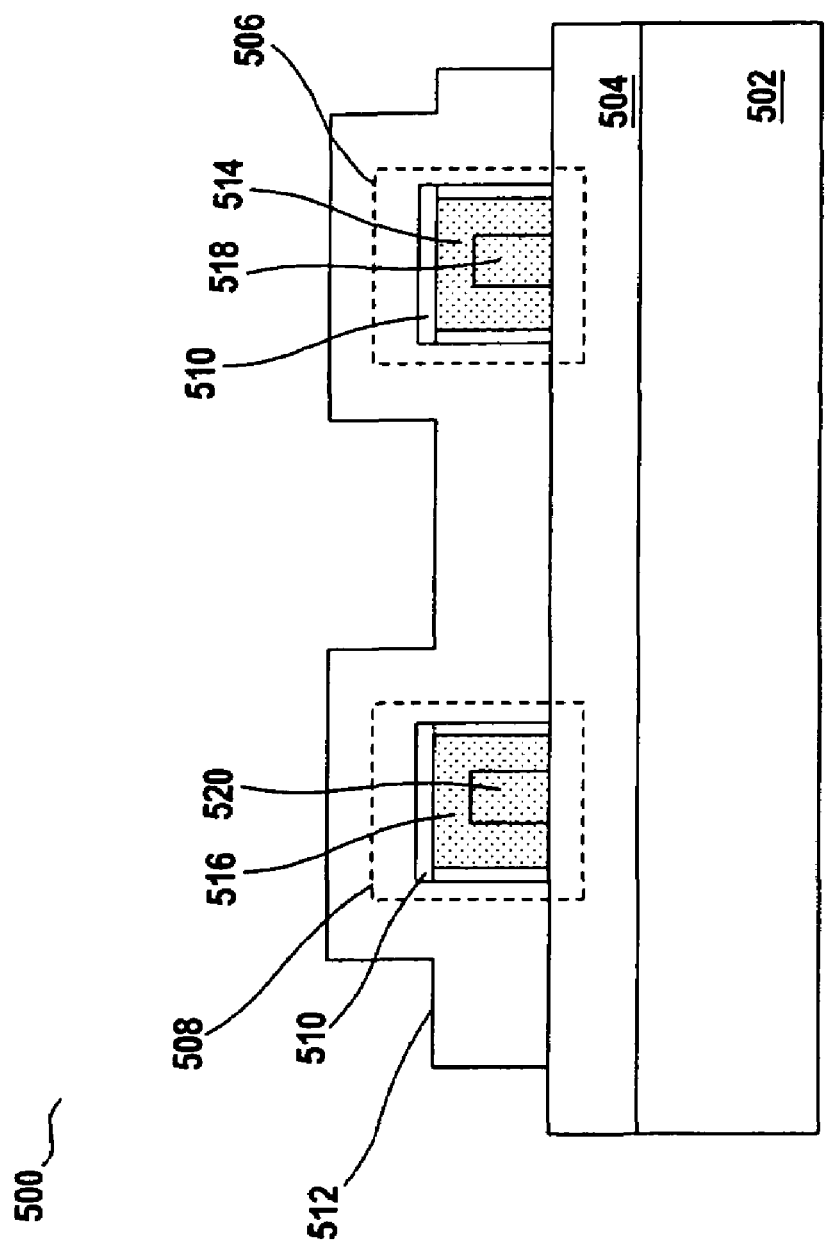
FIGS. 5-6 illustrate cross-sectional views of SOI transistors used in an SRAM cell, according to another embodiment of the present invention.
Figure 6:
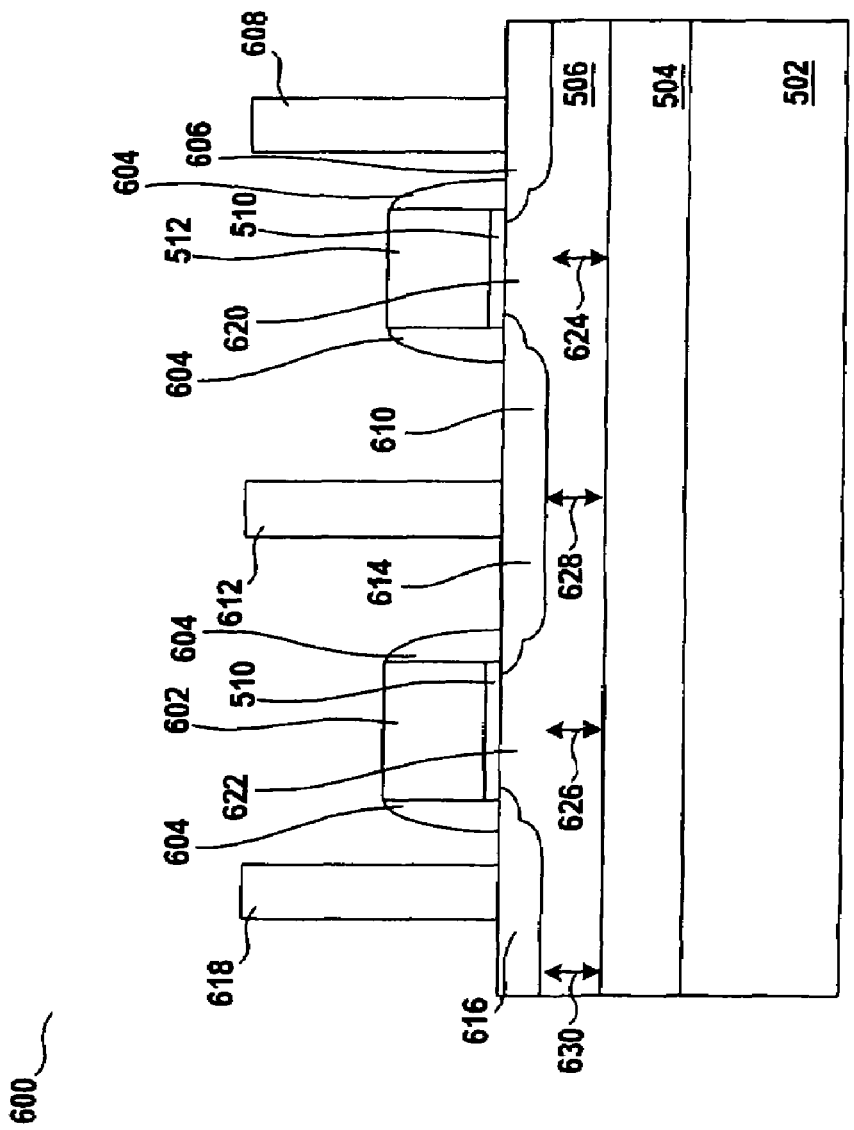

FIGS. 5 and 6 present another example of SOI devices according to the embodiment of the present invention. FIG. 5 illustrates a cross-sectional view 500 along the section line 222 shown in FIG. 2. An insulating layer 504 lies on the substrate 502. A silicon layer that was previously formed on the insulating layer 504, is patterned to form silicon islands that are, among others, a silicon island 506 that is P-doped for the PD transistor and a silicon island 508 that is N-doped for the PU transistor. A gate dielectric 510 is formed on the three exposed surfaces of the silicon islands 506 and 508. A gate electrode material, typically poly silicon, is deposited and patterned to form a gate electrode 512 for both the PD transistor and the PU transistor where the poly silicon of the gate electrode 512 crosses the width, and the height, on both sides, of silicon islands 506 and 508, respectively. The gate electrode 512 wraps around the top surface and, the right side surface, and the left side surface of the silicon islands 506 and 508. The active channels 514 and 516 lie under the gate electrode and gate dielectric on the top, left, and right sides of the silicon islands.

Since the PD transistor and the PU transistor are partially depleted SOI FinFETs, the active channel does not extend into the full volume of the fin. A central P-type core 518 is left in silicon island 506 as the P-well or body of the PD transistor. A central N-type core 520 is left in silicon island 508 as the N-well or body of the PU transistor. The P-type core 518 is part of the continuous OD area.

FIG. 6 illustrates a cross-sectional view 600 along the section line 226 shown in FIG. 2. This also cuts along the center of the P-type core 518 in FIG. 5. The substrate 502 and the insulating layer 504 are the same as those in FIG. 5. This view shows the same gate dielectric 510 shown in FIG. 5. This view also shows the width of the gate electrode 512 for the PD transistor, the width of the gate electrode 602 for the PG transistor, and the length of the silicon island 506 for those two transistors. The gate electrodes have sidewall spacers 604. The PD transistor has the gate electrode 512, a source diffusion region 606 with a source electrode 608, and a drain diffusion region 610 with a drain electrode 612. The PG transistor has the gate electrode 602, a drain diffusion region 614 with the drain electrode region 612, and a source diffusion region 616 with a source electrode 618. It is understood that the drain electrode 612 is shared by both the PD and the PG transistors.

In the present invention, the PD transistor and the PG transistor are partially depleted SOI devices. This means that the depletion region of an active NMOS channel 620, that is under the gate 512, and an active NMOS channel 622, that is under the gate 602, in the NMOS active region 506, do not extend into the full volume of the silicon islands. A remaining height 624 of the silicon beneath the active NMOS channel 620 is the P-well or body of the PD transistor. A remaining height 626 of the silicon beneath the active NMOS channel 622 is the P-well or body of the PG transistor. A remaining height 628 of the silicon beneath the drain diffusion 610 and the drain diffusion 614 is a part of the original P-doped silicon island 506 for NMOS.

Therefore, the lower portions of the finished P-doped silicon island 506 are all P-type and a continuous P-type layer lies along its entire length with no interruption. This is the OD area 630 that connects the bodies 624 and 626 of all of the NMOS PD and PG transistors to Vss via the strapping cell area 706 shown in FIG. 7. This OD area has low electrical resistance due to the relatively short transverse side of each SRAM cell area, thereby providing a good static noise margin.

The disclosed layout area of the SRAM cell array provides an OD area that runs through a number of SRAM cell areas without accumulating excessive resistance, and therefore providing a good static noise margin. The SRAM cell can be made using SOI devices that are formed on the OD area. A strapping area is provided for connecting the OD area to a fixed potential, thereby preventing the bodies of the SOI devices from floating.

The above illustration provides many different embodiments or embodiments for implementing different features of the invention. Specific embodiments of components and processes are described to help clarify the invention. These are, of course, merely embodiments and are not intended to limit the invention from that described in the claims.

Although the invention is illustrated and described herein as embodied in one or more specific examples, it is nevertheless not intended to be limited to the details shown, since various modifications and structural changes may be made therein without departing from the spirit of the invention and within the scope and range of equivalents of the claims. Accordingly, it is appropriate that the appended claims be construed broadly and in a manner consistent with the scope of the invention, as set forth in the following claims.

What is claimed is:

1. A layout structure of a static random access memory (SRAM) cell array having one or more SRAM cells, each of which has a pair of cross-coupled inverters and a pair of passing gate transistors coupled to the inverters for controlling outputs thereof, the layout structure comprising:
   at least one SRAM cell area in which the inverters and the passing gate transistors are constructed, having a longitudinal side substantially longer than a transverse side thereof;
   at least one oxide defined (OD) area formed on an insulating layer, extending across at least two neighboring SRAM cell areas for construction of the passing gate transistor and a pull-down transistor within the inverter thereon; and
   at least one strapping cell area interposed between the SRAM cell areas for connecting the OD area to a fixed potential, thereby preventing bodies of the passing gate transistor and the pull-down transistor from floating.

2. The layout structure of claim 1 wherein the longitudinal side is at least twice as long as the transverse side.

3. The layout structure of claim 1 wherein the transverse side is no longer than 0.5 um.

4. The layout structure of claim 1 wherein a distance between the pull-down transistor and a strapping cell in the strapping cell area is no longer than 16 um.

5. The layout structure of claim 1 wherein every two consecutive strapping cell areas are interposed with 8 to 128 SRAM cell areas.

6. The layout structure of claim 1 wherein every two consecutive strapping cell areas are interposed with 16 SRAM cell areas.

7. The layout structure of claim 1 further comprising at least one bit line area disposed substantially in parallel to the OD area and connected to a source/drain region of the passing gate transistor.

8. The layout structure of claim 1 further comprising one or more gate areas disposed substantially perpendicular to the OD area for construction of one or more gate electrodes to control the passing gate transistors and the pull-down transistor.

9. The layout structure of claim 1 further comprising at least one Vss line area disposed substantially perpendicular to the OD area and connected to a source/drain region of the pull-down transistor.

10. The layout structure of claim 1 wherein the bodies of the pull-down transistor and the passing gate transistor are partially depleted.

11. The layout structure of claim 1 wherein the OD area has a thickness between about 200 and 1500 angstroms.

12. A layout structure of a static random access memory (SRAM) cell array having one or more SRAM cells, each of which has a pair of cross-coupled inverters and a pair of passing gate transistors coupled to the inverters for controlling outputs thereof, the layout structure comprising:
   at least one SRAM cell area in which the inverters and the passing gate transistors are constructed, having a longitudinal side being at least twice longer than a transverse side thereof;
   at least one oxide defined (OD) area formed on an insulating layer, extending across at least two neighboring SRAM cell areas for construction of the passing gate transistor and a pull-down transistor within the inverter thereon;
   at least one a bit line area disposed substantially in parallel to the OD area and connected to a source/drain region of the passing gate transistor; and
   at least one strapping cell area interposed between the SRAM cell areas, in which a strapping cell is constructed for connecting the OD area to a fixed potential, thereby preventing bodies of the passing gate transistor and the pull-down transistor constructed on the OD area from floating.

13. The layout structure of claim 12 wherein every two consecutive strapping cell areas are interposed with 8 to 128 SRAM cell areas.

14. The layout structure of claim 12 further comprising at least one Vss line area disposed substantially perpendicular to the OD area and connected to a source/drain region of the pull-down transistor.

15. The layout structure of claim 12 wherein the bodies of the pull-down transistor and the passing gate transistor are partially depleted.

16. The layout structure of claim 12 wherein the OD area has a thickness between about 200 and 1500 angstroms.

17. A layout structure of a static random access memory (SRAM) cell array having one or more SRAM cells, each of which has a pair of cross-coupled inverters and a pair of passing gate transistors coupled to the inverters for controlling outputs thereof, the layout structure comprising:
   at least one SRAM cell area in which the inverters and the passing gate transistors are constructed, having a longitudinal side being at least twice longer than a transverse side thereof;
   at least one oxide defined (OD) area formed on an insulating layer, extending across at least two neighboring SRAM cell areas for construction of the passing gate transistor and a pull-down transistor within the inverter thereon;
   at least one bit line area disposed substantially in parallel to the OD area and connected to a source/drain region of the passing gate transistor;
   one or more gate areas disposed substantially perpendicular to the OD area for construction of one or more gate electrodes to control the passing gate transistors and the pull-down transistor; and
   at least one strapping cell area interposed between the SRAM cell areas, in which a strapping cell is constructed for connecting the OD area to a fixed potential through an interconnection structure, thereby preventing bodies of the passing gate transistor and the pull-down transistor from floating.

18. The layout structure of claim 17 wherein a distance between the pull-down transistor and the strapping cell is no longer than 8 um.

19. The layout structure of claim 17 further comprising at least one Vss line area disposed substantially perpendicular to the OD area and connected to a source/drain region of the pull-down transistor.

20. The layout structure of claim 17 wherein the OD area has a thickness between about 200 and 1500 angstroms.

* * * * *